United States Patent [19]

Vandegraaf

[11] 4,409,563

[45] Oct. 11, 1983

[54] PHASE LOCKED LOOP FREQUENCY SYNTHESIZER WITH FREQUENCY COMPRESSION LOOP

[75] Inventor: Johannes J. Vandegraaf, Lynchburg, Va.

[73] Assignee: General Electric Company, Lynchburg, Va.

[21] Appl. No.: 238,655

[22] Filed: Feb. 26, 1981

[51] Int. Cl.³ .......................... H03C 3/00; H03L 7/22
[52] U.S. Cl. ........................................ 331/11; 331/17;
331/25; 331/30; 331/DIG. 2; 332/19
[58] Field of Search ..................................... 331/10-12,
331/17, 23, 25, 30, DIG. 2; 332/19

[56] References Cited

U.S. PATENT DOCUMENTS

| | | | |
|---|---|---|---|
| 3,262,068 | 7/1966 | Kawai et al. | 331/11 |
| 3,286,191 | 11/1966 | Cornwell | 331/11 |
| 3,393,380 | 7/1968 | Webb et al. | 332/19 |
| 3,609,577 | 9/1971 | Bos | 331/17 |
| 3,611,175 | 10/1971 | Boelke | 331/11 X |
| 3,614,648 | 10/1971 | Byrne | 331/14 |
| 3,703,686 | 11/1972 | Hekimian | 331/11 |
| 3,959,737 | 5/1976 | Tanis | 331/11 X |
| 4,069,462 | 1/1978 | Dunn | 331/11 |
| 4,242,649 | 12/1980 | Washburn, Jr. | 332/19 X |

FOREIGN PATENT DOCUMENTS

| | | | |
|---|---|---|---|
| 2402696 | 2/1975 | Fed. Rep. of Germany | 331/11 |
| 1526928 | 10/1978 | United Kingdom | 331/11 |

Primary Examiner—Siegfried H. Grimm
Attorney, Agent, or Firm—Cushman, Darby & Cushman

[57] ABSTRACT

A phase locked loop synthesizer including a phase locked loop (PLL) having a first characteristic loop bandwidth, for generating a synthesized signal, the PLL including a signal controlled oscillator (SCO) having first and second control inputs for controlling the frequency of the SCO, the first control input receiving a signal from the PLL, and a subsidiary frequency compression loop (FCL) having a second characteristic bandwidth wider than said first characteristic bandwidth, the FCL having an output coupled to the second control input of the SCO whereby said SCO is subject to frequency control by both the PLL and the FCL.

17 Claims, 2 Drawing Figures

PHASE LOCKED LOOP FREQUENCY SYNTHESIZER WITH FREQUENCY COMPRESSION LOOP

BACKGROUND OF THE INVENTION

This invention relates generally to frequency synthesizers. Specifically, the invention is the addition, to a known phase-locked loop (PLL) synthesizer, of a subsidiary frequency compression loop (FCL).

Frequency synthesizers are utilized in both transmitters and receivers to provide transmitter oscillator and local oscillator signals, respectively. They generally include a phase-locked loop, having one or more programmable dividers, which locks onto selected harmonics of a reference frequency that is typically crystal controlled. A known frequency synthesizer using a phase-locked loop is shown in FIG. 1.

A signal controlled oscillator such as voltage controlled oscillator (VCO) 20 includes a first output 22 providing the synthesized signal and a second output 24. A mixer 26 mixes the signal from output 24 of VCO 20 with that of a frequency source 28 to provide a down-conversion of the VCO signal on an output line 30 of the mixer. Output line 30 is coupled to the signal input of a programmable divider 32, the divide ratio of which is controlled by frequency controller 34. The output of programmable divider 32 is coupled to a loop phase detector 36 which compares the signal from programmable divider 32 with that of a reference frequency source 38. Phase detector 36 produces a signal on an output line 40 that is a function of the phase difference between the signals coupled thereto from programmable divider 32 and reference frequency source 38. The output 40 of phase detector 36 is coupled through an amplifier and low pass filter 42 to the control input 44 of VCO 20.

In essence, the loop gain of a phase-locked loop is a function of the phase error that is required to get the VCO onto the desired frequency. Thus, if the loop has a high loop gain, a small phase change at the output of the loop's phase detector causes a large swing in the frequency of the VCO signal. The bandwidth of a phase-locked loop is a measure of the loop's response to a phase change of the reference signal. The loop bandwidth is generally determined by the loop's low pass filter, phase detector, and the control sensitivity of the VCO.

As a practical matter, the loop must have a limited bandwidth because an averaged or filtered control signal must be coupled to the control input of the VCO. Based upon various design considerations, such as the desired tracking range of the loop and the modulation to be applied, for a typical synthesizer used in radio equipment selectively operable on radio channels that are spaced at 25 kHz intervals, the bandwidth of the loop cannot be made much wider than 1 kHz.

For synthesizers used in FM communication equipment, it is particularly important to minimize the phase noise, i.e. phase perturbation, of the VCO output signal. Phase noise outside the tracking bandwidth of the loop is mainly determined by the noise of the VCO itself, including contributions to external mechanical disturbances, such as for example, microphonics.

One approach to solving the phase noise problem is to build a very low noise VCO. However, this approach may not be practical due to cost and high power consumption.

SUMMARY OF THE INVENTION

In order to overcome the operational disadvantages of the conventional phase locked loop frequency synthesizer without having to resort to the use of an expensive low noise VCO, there is provided a phase locked loop synthesizer arrangement into which there is incorporated a subsidiary frequency compression loop (FCL).

The frequency compression loop includes a frequency discriminator, a switchable filter circuit, a summing circuit, and an amplifier-low pass filter combination. The FCL is coupled into the PLL so as to receive the down converted VCO signal from mixer 26 (the input signal to programmable divider 32) and operates to supply a second control signal to operate VCO 20.

In essence, the input signal to the programmable divider 32 (typically in the range of 1.5–3 or 2–4 MHz., depending on channel capacity) is also utilized as the input to the frequency discriminator of the FCL. The output of the discriminator is AC coupled through a simple filter circuit and summing to an amplifier and low pass filter combination. The output of the amplifier and low pass filter combination in turn controls a second input of VCO 20 so as to control its frequency.

The FCL acts as a frequency deviation compression system. Any spurious frequency modulation on the VCO due to noise or microphonics will be reduced by the loop gain of the FCL. The loop gain of the FCL is equal to the product of the discriminator sensitivity, the amplifier gain and the control sensitivity of the VCO. Since the lowest frequency at the output of the discriminator is above 1 MHz., the FCL can be designed to have a much wider band width than that of the PLL. This allows the phase noise on the VCO to be reduced over a much wider bandwidth than possible operating merely with the PLL, assuming there is loop gain in the FCL.

A low frequency cut-off which frequency pass circuit is designed into the FCL by use of the simple filter circuit which couples the output of the frequency discriminator to the summing circuit. This cut-off permits the basic PLL to control the VCO at the lower frequencies down to D.C.

It is possible to use the FCL during acquisition mode operation of the PLL by initially extending its frequency response down to DC and by introducing an appropriate DC reference control voltage or current into the output of the discriminator. In this way, the VCO can be forced to a particular frequency. This can occur very rapidly because of the wide bandwidth of the loop. In order to provide response down to DC, the simple filter circuit coupling the discriminator to the input of the summing circuit is shorted by a switch operable by a lock detector. When the lock detector indicates that the loop is out of lock and must acquire, the switch shorts the filter circuit so that the frequency discriminator is DC coupled to the summing circuit. Once the PLL has acquired lock, then it is desirable to open up the DC connection to the discriminator by opening the shorting switch. If this were not done, a phase error would be introduced into the phase lock control due to the inevitable inaccuracy of the FCL.

The use of a subsidiary FCL provides many operational advantages not possible operating only with the conventional PLL. For example, it is possible to use the frequency control element that normally controls the divide ratio of programmable divider 32 to quickly set the output reference of the discriminator within the FCL in order to bring the VCO into close frequency for lock-in. The frequency control element 34, generally providing a digital signal to programmable divider 32, is digital to analog converted before its application to the frequency control loop.

Also, the output of phase detector 36 can be used to indicate the locked or unlocked status of the PLL to disconnect or reconnect the frequency discriminator directly to the summing circuit.

Most importantly, the bandwidth of the PLL is normally limited by the reference frequency established by reference frequency source 38. This is because the reference frequency source 38 is selected to be compatible with the channel spacing of the radio device in which the PLL is operating and the PLL loop characteristics must be designed compatibly with that reference frequency source. The use of a discriminator circuit in a subsidiary FCL provides control over a wider bandwidth, i.e. two band control—one band being determined by the basic PLL and the second being determined by the FCL.

Furthermore, the use of a subsidiary FCL allows the introduction of a modulating signal to the FCL in addition to or as a substitute to modulation introduced directly to the VCO.

Also, if the VCO is non-linear and the discriminator is linear, the use of a subsidiary FCL including a discriminator will, in essence, linearize the VCO. This allows the modulating signal to be introduced elsewhere, as for example, to the VCO.

Thus, there is provided a frequency synthesizer comprising:

a phase locked-loop (PLL) including a voltage controlled oscillator (VCO), a programmable divider for dividing the signal from the VCO, a frequency control means for controlling the divide ratio of the programmable divider, a reference source and a phase detector for comparing a signal from the reference source with an output signal of the divider and for generating a phase detector signal related thereto, and a loop filter for filtering the phase detector signal and providing a VCO control signal for controlling the frequency of the VCO; and a frequency compression loop (FCL) having an input coupled to the output of the VCO and an output for coupling to a control input of the VCO so as to control the frequency thereof, the FCL having a wider band than that of the phase-locked loop synthesizer without the frequency compression loop.

BRIEF DESCRIPTION OF THE DRAWINGS

These and other objects and advantages of the present invention will be more completely understood by study of the following detailed description of the presently preferred embodiment of the invention in conjunction with the accompanying drawings, wherein.

DETAILED DESCRIPTION OF THE PREFERRED EMBODIMENT

Figure 2:
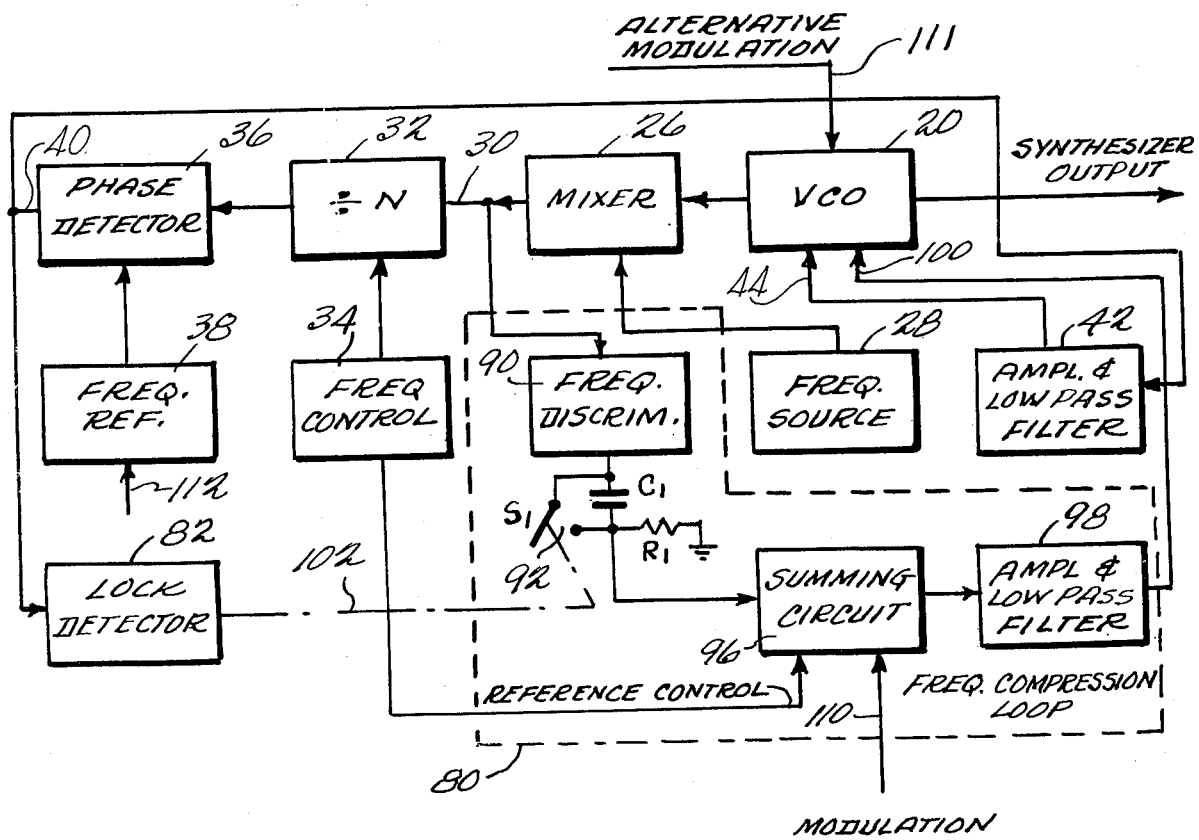
FIG. 2 is a block diagram of a phase-locked loop synthesizer including a frequency compression loop, according to the present invention.

Referring now to FIG. 2, there is shown a block diagram of a phase locked loop frequency synthesizer including a frequency compression loop, according to the present invention.

Figure 1:
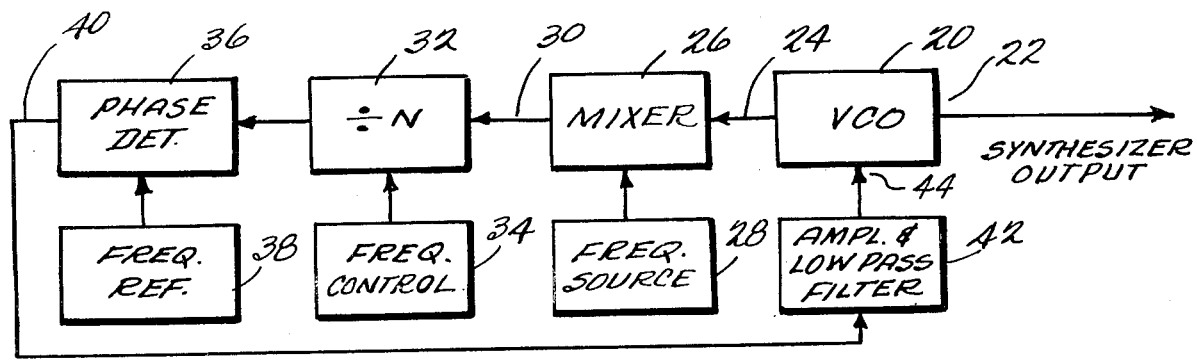
FIG. 1 is a block diagram of a known phase-locked loop frequency synthesizer.

The various elements of the basic phase locked loop (as shown in FIG. 1) are marked with corresponding reference numerals to denote their equivalent counterparts in FIG. 2. The difference between conventional phase locked loop synthesizer shown in FIG. 1 and the synthesizer shown in FIG. 2 is the addition of a frequency compression loop (FCL) 80 and a lock detector 82.

Since the reference source 38 frequency is equal to the channel spacing (25 KHz., for example, or a submultiple thereof) and since further low pass filtering is necessary to filter out the detection components at the output of phase detector 36, the closed loop bandwidth of the phase locked loop is limited to typically less than one (1) KHz. This constraint prevents the phase noise of VCO 20 from being reduced by the lower phase noise of reference source 38 above a few hundred Hz because of inadequate loop gain. VCO 20 is also subject to microphonics and is difficult to acquire because of limited loop bandwidth. The addition of FCL 80 and lock detector 82 obviates these problems.

In the phase locked loop synthesizer, according to this invention, the input signal to programmable divider 32 is coupled to the input of a frequency discriminator 90. The output of frequency discriminator 90 is AC coupled via an RC circuit 92 to a first input 94 of a summing circuit 96. RC circuit 92 is a simple low frequency cut-off or high pass filter circuit, for passing only the AC component of the discriminator output above the cut-off frequency of the primary phase locked loop.

Summing circuit 96 has a second input coupled to an output of frequency control circuit 34 controlling the divide ratio of programmable divider 32 and a third input for receiving a modulation signal. The output of summing circuit 96 is coupled through an amplifier and low pass filter 98 to a second control input 100 of VCO 20. RC circuit 92 includes a switch $S_1$ which can selectively short capacitor $C_1$ in accordance with a control signal on a signal line 102 from lock detector 82.

The additional components added to the basic phase locked loop shown in FIG. 1, act as a frequency deviation compression system. Any spurious frequency modulation on VCO 20 due to noise or microphonics, is reduced by the loop gain of FCL 80. The loop gain of FCL 80 is essentially the product of the sensitivity of frequency discriminator 90 the control sensitivity of the VCO 20 and the gain of amplifier and low pass filter 98. Since the lowest frequency at the output of discriminator 90 is above one MHz., a much wider loop can be configured than that of the basic phase locked loop shown in FIG. 1. Thus, the phase noise of VCO 20 can be reduced over a much wider bandwidth than it could be in the basic phase locked loop arrangement, provided there is loop gain. The low frequency cut-off resulting from RC circuit 92 is necessary to permit the basic phase locked loop to control VCO 20 at lower frequencies.

It is possible to use the FCL 80 during acquisition mode operation of the phase locked loop by initially extending FCL 80 frequency response down to DC and by introducing an appropriate DC reference control voltage or current into the output of the discriminator 90. In this way, VCO 20 can be forced to a particular frequency, this can be done very rapidly because of the wide bandwidth of FCL 80. The DC voltage or current is applied by shorting capacitor $C_1$ with switch $S_1$ controlled by a signal from lock detector 82 indicating that the loop is not locked.

Once the phase locked-loop has acquired and locked, it is desirable to open up the DC connection to discriminator 90. Otherwise, a phase error is introduced into phase locked control due to the inevitable inaccuracy of frequency control loop 80. Thus, when lock detector 82 senses a locked condition, switch $S_1$ is triggered to open.

The VCO may be modulated at several places. A modulating signal may be applied to summing circuit 96 via a signal line 110. As alternatives, modulating signals may be introduced directly to the VCO via a signal line 111 or the frequency reference 38 via a signal line 112. If VCO 20 is non-linear and discriminator 90 is linear, the discriminator loop can be used to linearize VCO 20.

Therefore, there has been provided a phase locked loop frequency synthesizer including the conventional phase locked loop components, and, in addition, a frequency compression loop providing a means for broadening the bandwidth of the loop for minimizing the phase instability of the loop VCO and for linearizing it.

Of course alternative embodiments and arrangements will occur to those of ordinary skill in the art having the benefit of the teachings of this patent. Therefore, such alternative embodiments and arrangements are intended to be within the scope of the claims presented herein.

I claim:

1. A frequency synthesizer comprising:
a phase locked loop including a signal controlled oscillator (SCO), a programmable frequency divider for dividing a signal from said SCO, a frequency control means for controlling the divide ratio of said programmable divider, a reference source, and a phase detector for comparing a signal from said reference source with an output signal of said divider and generating a phase detector signal related to the phase difference therebetween, and a loop filter for filtering the phase detector signal and providing a SCO control signal for controlling the frequency of said SCO; and
a frequency compression loop within said phase locked loop having an input coupled to the output of said SCO and an output for coupling to a control input of said SCO so as to provide a subsidiary control of the frequency thereof, the frequency compression loop having a wider bandwidth than that which the phase-locked loop synthesizer would have in the absence of the frequency compression loop, said frequency compression loop including:
a frequency discriminator coupled to the output of said SCO;
a summing circuit coupled to the output of said frequency discriminator; and
an amplifier and low pass filter, responsive to the output of said summing circuit for providing a control signal to a control input of said SCO; and
high pass circuit means for coupling the output of the frequency discriminator to the input of the summing circuit.

2. A frequency synthesizer according to claim 1 further comprising:
a lock detector coupled to the output of the phase detector for detecting when the phase locked loop is in a non-locked condition, and
means responsive to the detection of a non-locked condition by said lock detector for bypassing said high pass circuit means so as to apply the frequency discriminator output directly to the summing circuit.

3. A frequency synthesizer according to any one of claims 1 or 2 further including means for modulating the SCO comprising means for applying a modulating signal to the summing circuit.

4. A frequency synthesizer according to any one of claims 1 or 2 further including means for modulating the SCO.

5. A phase locked loop frequency synthesizer comprising:
phase locked loop (PLL) means including a signal controlled oscillator (SCO) for providing a synthesized output signal of said frequency synthesizer, said PLL means having a predetermined PLL acquisition bandwidth and being operable in either a locked or non-locked mode; and
a frequency compression loop (FCL) including a frequency discriminator coupled to said PLL means for forcing the frequency of said SCO within said acquisition bandwidth of said PLL means whenever said PLL means is not locked wherein said FCL comprises:
frequency discriminator means having an input for receiving a signal derived from said signal controlled oscillator for providing a discriminator signal;
summing circuit means for summing said discriminator signal with a modulating signal; and
an amplifier and low pass filter coupled to said summing circuit for providing a control signal for controlling the frequency of said signal controlled oscillator.

6. A synthesizer according to claim 5 wherein said FCL further comprises:
a filter circuit coupling the output of said frequency discriminator to said summing circuit; and
switch means for selectively bypassing said filter circuit.

7. A synthesizer according to claim 6 further comprising
lock detector means, coupled to said phase locked loop, for causing said switch means to bypass said filter circuit whenever said phase locked loop is not locked.

8. A synthesizer according to claim 5, 6 or 7 wherein the bandwidth of the FCL is greater than the bandwidth of the PLL.

9. A phase locked loop frequency synthesizer comprising:
a phase locked loop (PLL) including a signal controlled oscillator (SCO), a reference signal source, a programmable divider for dividing an output signal of said SCO, frequency control means for controlling the divide ratio of the programmable divider, and a phase detector responsive to an output of said divider and said reference signal source for controlling said signal controlled oscillator,
a frequency compression loop (FCL) including a frequency discriminator for discriminating a signal derived from said SCO, a summing circuit coupled to an output of the frequency discriminator and adapted to receive a modulating signal, an amplifier and low pass filter coupled to an output of the summing circuit, and means for applying an output of the amplifier and low pass filter to a control input of said signal controlled oscillator; and means for applying an output of said frequency control means to said summing circuit to control the output of the FCL applied to said signal controlled oscillator.

10. A synthesizer according to claim 9 further comprising:
a high pass filter circuit coupling only the A.C. component of the output of said frequency discriminator above the cut-off frequency of the phase locked loop to said summing circuit;
switch means for selectively bypassing said filter circuit; and
a lock detector responsive to said phase detector to control said switch means.

11. A synthesizer according to claim 9 further comprising means for modulating said signal controlled oscillator.

12. A synthesizer according to claim 9, 10 or 11 wherein the bandwidth of the FCL is greater than the bandwidth of the PLL.

13. A phase locked loop synthesizer, comprising:
phase locked loop (PLL) means, having a first characteristic loop bandwidth, for generating a synthesized signal, said PLL means including a signal controlled oscillator (SCO) having first and second control inputs for controlling the frequency of said SCO, said first control input receiving a signal from said PLL; and
subsidiary frequency compression loop (FCL) means having a second characteristic bandwidth wider than said first characteristic bandwidth, said FCL means having an output coupled to said second control input of said SCO whereby said SCO is subject to frequency control by both said PLL means and said FCL means.

14. A synthesizer according to claim 13 wherein said PLL means further comprises:
a mixer for down-converting an output of said SCO with a first reference source signal;
a programmable divider for dividing the output of said mixer;
a frequency control element for controlling the divide ratio of the programmable divider;
a phase detector for comparing the phase of a signal from said programmable divider with the signal from a second reference signal source and providing a phase reference signal indicative thereof; and
an amplifier and low pass filter coupling an output of said phase detector to a reference input of said signal controlled oscillator.

15. A synthesizer according to claim 14 wherein said FCL means comprises:

a frequency discriminator coupled to an output of said mixer;
a summing circuit coupled to the output of said frequency discriminator and adapted to receive a modulating signal; and
a second amplifier and low pass filter coupling an output of said summing circuit to a control input of said signal controlled oscillator.

16. A synthesizer according to claim 15 wherein said FCL means further comprises:
a filter circuit coupling the output of said frequency discriminator to said summing circuit;
switch means for selectively bypassing said filter circuit; and
a lock detector responsive to said phase detector for detecting a lock condition of said phase locked loop and controlling said switch means.

17. A phase locked loop frequency synthesizer, comprising
phase locked loop (PLL) means for generating a synthesizer signal, said PLL means comprising:
a signal controlled oscillator (SCO);
a mixer for mixing an output of said SCO with a reference source signal;
a programmable divider for dividing the output of said mixer;
a frequency control element for controlling the divide ratio of the programmable divider;
a phase detector for comparing the phase of a signal from said programmable divider with a signal from a second reference signal source and providing a phase difference signal indicative thereof; and
an amplifier and low pass filter coupling an output of said phase detector to a reference input of said SCO;
and
frequency compression loop (FCL) means for controlling the frequency of said SCO responsive to a signal from said PLL means, said FCL means including means for introducing modulation therein which in turn modulates said SCO, said FCL means comprising:
a frequency discriminator coupled to an output of said mixer;
a summing circuit coupled to the output of said frequency discriminator and adapted to receive a modulating signal; and
a second amplifier and low pass filter coupling an output of said summing circuit to a control input of said SCO;
said synthesizer further comprising:
a filter circuit coupling the output of said frequency discriminator to said summing circuit;
switch means for selectively bypassing said filter circuit; and
a lock detector responsive to said phase detector for detecting a lock condition of said PLL and controlling said switch means.

* * * * *

UNITED STATES PATENT AND TRADEMARK OFFICE
CERTIFICATE OF CORRECTION

PATENT NO. : 4,409,563

DATED : October 11, 1983

INVENTOR(S) : Johannes J. Vandegraaf

It is certified that error appears in the above-identified patent and that said Letters Patent is hereby corrected as shown below:

Col. 2, line 41, after "cut-off" cancel "which" and insert -- or high --

Signed and Sealed this

Fourteenth Day of August 1984

[SEAL]

Attest:

GERALD J. MOSSINGHOFF

Attesting Officer     Commissioner of Patents and Trademarks